(12) United States Patent
Eifuku

(10) Patent No.: US 10,034,389 B2
(45) Date of Patent: Jul. 24, 2018

(54) ELECTRIC COMPONENT MOUNTING METHOD

(71) Applicant: PANASONIC INTELLECTUAL PROPERTY MANAGEMENT CO. LTD., Osaka (JP)

(72) Inventor: Hideki Eifuku, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 237 days.

(21) Appl. No.: 14/391,489

(22) PCT Filed: Mar. 15, 2013

(86) PCT No.: PCT/JP2013/001785
§ 371 (c)(1),
(2) Date: Oct. 9, 2014

(87) PCT Pub. No.: WO2013/157197
PCT Pub. Date: Oct. 24, 2013

(65) Prior Publication Data
US 2015/0121692 A1  May 7, 2015

(30) Foreign Application Priority Data

Apr. 19, 2012 (JP) ................................ 2012-095918

(51) Int. Cl.
*H05K 3/34* (2006.01)
*H01L 23/00* (2006.01)

(52) U.S. Cl.
CPC ............ *H05K 3/341* (2013.01); *H01L 24/16* (2013.01); *H01L 24/29* (2013.01); *H01L 24/73* (2013.01);
(Continued)

(58) Field of Classification Search
CPC ......... H01L 24/13; H01L 24/16; H01L 24/29; H01L 24/32; H01L 24/563; H01L 24/73;
(Continued)

(56) References Cited

U.S. PATENT DOCUMENTS 4,404,453 A * 9/1983 Gotman ................. H01L 24/81
219/121.64
6,621,157 B1 * 9/2003 Wirz ....................... H01L 24/75
156/105
(Continued)

FOREIGN PATENT DOCUMENTS

JP  58-43597 A    3/1983
JP  07-326642 A   12/1995
(Continued)

OTHER PUBLICATIONS

Machine Translation of Japanese Patent Publication JP 10-322011, dated Sep. 2016.*
(Continued)

Primary Examiner — A. Dexter Tugbang
(74) Attorney, Agent, or Firm — McDermott Will & Emery LLP

(57) ABSTRACT

Provided is an electronic component mounting method including the steps of: placing an electronic component having a primary surface on which a first electrode is formed, on a circuit member having a primary surface on which a second electrode corresponding to the first electrode is formed, with solder and a bonding material including a thermosetting resin interposed between the first and second electrodes; subjecting the thermosetting resin to a first heating at a temperature lower than the melting point of the solder and thus causing the resin to cure, while pressing the electronic component against the circuit member, and then releasing pressure applied for the pressing; and subjecting the solder interposed between the first and second electrodes
(Continued)

US 10,034,389 B2

Page 2 to a second heating with the pressure released, and thus melting the solder to electrically connect the first and second electrodes.

6 Claims, 4 Drawing Sheets

(52) U.S. Cl.
CPC .............. *H01L 24/75* (2013.01); *H01L 24/81* (2013.01); *H01L 24/83* (2013.01); *H01L 24/92* (2013.01); *H01L 24/97* (2013.01); *H05K 3/3436* (2013.01); *H05K 3/3494* (2013.01); H01L 24/13 (2013.01); H01L 24/32 (2013.01); H01L 24/743 (2013.01); H01L 2224/131 (2013.01); H01L 2224/13111 (2013.01); H01L 2224/16058 (2013.01); H01L 2224/16059 (2013.01); H01L 2224/16225 (2013.01); H01L 2224/16227 (2013.01); H01L 2224/2732 (2013.01); H01L 2224/27334 (2013.01); H01L 2224/293 (2013.01); H01L 2224/2929 (2013.01); H01L 2224/29387 (2013.01); H01L 2224/32225 (2013.01); H01L 2224/73104 (2013.01); H01L 2224/73204 (2013.01); H01L 2224/755 (2013.01); H01L 2224/7565 (2013.01); H01L 2224/7598 (2013.01); H01L 2224/75252 (2013.01); H01L 2224/75272 (2013.01); H01L 2224/75301 (2013.01); H01L 2224/75611 (2013.01); H01L 2224/75745 (2013.01); H01L 2224/8121 (2013.01); H01L 2224/81191 (2013.01); H01L 2224/81193 (2013.01); H01L 2224/81447 (2013.01); H01L 2224/81815 (2013.01); H01L 2224/81907 (2013.01); H01L 2224/8321 (2013.01); H01L 2224/83191 (2013.01); H01L 2224/83192 (2013.01); H01L 2224/83203 (2013.01); H01L 2224/83815 (2013.01); H01L 2224/83862 (2013.01); H01L 2224/92143 (2013.01); H01L 2224/97 (2013.01); H01L 2924/01322 (2013.01); H01L 2924/15787 (2013.01); H05K 2201/10674 (2013.01); H05K 2201/10977 (2013.01); H05K 2203/1189 (2013.01); Y02P 70/613 (2015.11); Y10T 29/49144 (2015.01); Y10T 29/53174 (2015.01)

(58) Field of Classification Search
CPC ....... H01L 24/743; H01L 24/75; H01L 24/81; H01L 24/83; H01L 24/92; H01L 24/97; H01L 2224/131; H01L 2224/13111; H01L 2224/16058; H01L 2224/16059; H01L 2224/16227; H01L 2224/2732; H01L 2224/2929; H01L 2224/293; H01L 2224/29387; H01L 2224/32225; H01L 2224/73104; H01L 2224/73204; H01L 2224/75252; H01L 2224/75611; H01L 2224/7565; H01L 2224/75745; H01L 2224/81191; H01L 2224/81193; H01L 2224/8121; H01L 2224/81447; H01L 2224/81815; H01L 2224/81907; H01L 2224/83191; H01L 2224/83192; H01L 2224/83203; H01L 2224/8321; H01L 2224/83815; H01L 2224/83862; H01L 2224/7598; H01L 2224/97; H01L 2224/27334; H01L 2224/16225; H01L 2924/00; H01L 2924/01029; H01L 2924/0103; H01L 2924/01047; H01L 2924/01049; H01L 2924/01051; H01L 2924/01083; H01L 2924/014; H01L 2924/00014; H01L 2924/010322; H05K 3/341; H05K 3/3436; H05K 3/3494; Y10T 29/49144; Y10T 29/53174

See application file for complete search history.

(56) References Cited

U.S. PATENT DOCUMENTS

| | | | |
|---|---|---|---|
| 7,341,642 B2 * | 3/2008 | Kumakura | ............ H01L 21/563 156/273.5 |
| 2002/0142177 A1 * | 10/2002 | Yamakawa | ........... H01L 21/563 428/447 |
| 2004/0047127 A1 * | 3/2004 | Yamauchi | ............... H01L 24/29 361/688 |
| 2005/0110164 A1 | 5/2005 | Pendse | |
| 2006/0216860 A1 | 9/2006 | Pendse | |
| 2007/0105277 A1 | 5/2007 | Pendse et al. | |
| 2007/0241464 A1 | 10/2007 | Pendse et al. | |
| 2008/0213941 A1 | 9/2008 | Pendse | |
| 2009/0045507 A1 | 2/2009 | Pendse et al. | |
| 2009/0229123 A1 | 9/2009 | Sakai et al. | |
| 2009/0230552 A1 | 9/2009 | Pendse | |
| 2009/0250811 A1 | 10/2009 | Pendse | |
| 2009/0258460 A1 * | 10/2009 | Oi | ......................... H01L 21/563 438/108 |
| 2009/0291314 A1 | 11/2009 | Sakai et al. | |
| 2010/0007019 A1 | 1/2010 | Pendse | |
| 2010/0065966 A1 | 3/2010 | Pendse et al. | |
| 2010/0099222 A1 | 4/2010 | Pendse et al. | |
| 2010/0164100 A1 | 7/2010 | Pendse | |
| 2010/0193947 A1 | 8/2010 | Pendse | |
| 2011/0074024 A1 | 3/2011 | Pendse | |
| 2011/0084386 A1 | 4/2011 | Pendse | |
| 2011/0121464 A1 | 5/2011 | Pendse | |
| 2011/0215468 A1 | 9/2011 | Pendse | |
| 2011/0248399 A1 | 10/2011 | Pendse | |
| 2011/0309500 A1 | 12/2011 | Pendse | |
| 2012/0068337 A1 | 3/2012 | Pendse | |
| 2012/0133043 A1 | 5/2012 | Pendse et al. | |
| 2012/0211887 A1 | 8/2012 | Pendse | |
| 2012/0273943 A1 | 11/2012 | Pendse et al. | |
| 2013/0026628 A1 | 1/2013 | Pendse | |

FOREIGN PATENT DOCUMENTS

| | | | |
|---|---|---|---|
| JP | 10-056260 | A | 2/1998 |
| JP | 10-112478 | A | 4/1998 |
| JP | 10-322011 | A | 12/1998 |
| JP | 2000-058597 | A | 2/2000 |
| JP | 2006-100457 | A | 4/2006 |
| JP | 2007260683 | A * | 10/2007 |
| JP | 2008-069316 | A | 3/2008 |
| JP | 2008-072038 | A | 3/2008 |
| JP | 2008-535225 | A | 8/2008 |
| WO | 2005-048311 | A2 | 5/2005 |
| WO | 2006-105015 | A2 | 10/2006 |
| WO | 2008-032867 | A1 | 3/2008 |
| WO | 2008-032870 | A2 | 3/2008 |

OTHER PUBLICATIONS

Japanese Office Action issued in Japanese Application No. 2014-511087 dated Feb. 9, 2016.
International Search Report issued in PCT/JP2013/001785, dated Jun. 18, 2013, with English translation.

* cited by examiner

ELECTRIC COMPONENT MOUNTING METHOD

RELATED APPLICATIONS

This application is the U.S. National Phase under 35 U.S.C. § 371 of International Application No. PCT/JP2013/001785, filed on Mar. 15, 2013, which in turn claims the benefit of Japanese Application No. 2012-095918, filed on Apr. 19, 2012, the disclosures of which Applications are incorporated by reference herein.

TECHNICAL FIELD

The present invention relates to a mounting method and a mounting line for mounting an electronic component on a circuit member by using solder and a bonding material including a thermosetting resin.

BACKGROUND ART

When an electronic component such as a flip chip is mounted on a circuit member such as a printed substrate, a reflow method is widely used, the method including the steps of: interposing solder and a bonding material including a thermosetting resin between an electrode on the component and an electrode on the substrate; and then heating the solder and the bonding material to cause the solder to melt and the thermosetting resin to cure. The molten solder spreads between the electrodes and wets them; and is then cooled to form a solder joint therebetween. Thus, an electrical connection is achieved between the electrodes. Meanwhile, the cured substance of the thermosetting resin becomes a resin-reinforced portion for protecting the solder joint.

As one mounting method by the reflow method, a proposal has been made to use a thermosetting resin which cures at a temperature lower than the melting point of the solder, by first causing the resin to cure at a low temperature and then heating the solder at a temperature equal to or higher than its melting point, thereby to bond the electrodes together via the solder (c.f., Patent Literature 1). In this mounting method, curing of the thermosetting resin and melting of the solder are conducted while the electronic component is pressed against the circuit member. This is because the distance between the electrode on the circuit member and the electrode on the electronic component usually varies. Moreover, this is to prevent poor electric connection due to the interposition of the thermosetting resin between the electrodes as well as poor contact between the molten solder and the electrodes.

There has also been a proposal to pre-coat an electrode on a circuit member with solder in advance, and to then mount an electronic component with solder bumps on the circuit member via a thermosetting resin. At the time of mounting, the lower end portion of the solder bumps is made to wedge into the pre-coat solder. In this case, a proposal has been made to cause curing of the thermosetting resin and melting of the solder without any pressing of the electronic component against the circuit member (c.f., Patent Literature 2).

CITATION LIST

Patent Literature

[Patent Literature 1] Japanese Laid-Open Patent Publication No. 2000-58597

[Patent Literature 2] Japanese Laid-Open Patent Publication No. Hei 10-322011

SUMMARY OF INVENTION

Technical Problem

As in Patent Literature 1, when the electronic component is mounted on the circuit member while load is applied from the component toward the member, a bonding tool is used. The bonding tool abuts onto the back surface of the component and becomes heated while it presses the component. Regarding the temperature of the bonding tool at the time of pressing the electronic component, a temperature profile is configured such that a low temperature for curing the thermosetting resin would change to a high temperature for melting the solder. Therefore, every time mounting of the electronic component is completed, the bonding tool needs to be cooled down from a temperature equal to or higher than the melting point of the solder to a temperature lower than that melting point. Therefore, the takt time for mounting becomes long, thereby causing the problem of low productivity.

If the temperature of the bonding tool is equal to or higher than the melting point from before curing of the thermosetting resin, control of pressure in pressing the electronic component would be difficult. That is, when the bonding tool lands on the back surface of the electronic component, the molten solder may protrude from between the electronic component and the circuit member and spread outwards.

Moreover, when a plurality of the electronic components is mounted while load is applied from the components toward the circuit member, the components basically needs to be mounted one at a time. If an attempt is made to mount all of the electronic components at once, the magnitude of the pressure applied for the pressing would vary among the components. This would create a situation where the solder spreads out at a part of the electronic components and poor connection occurs at another part of the electronic components. Thus, securing reliability of the solder joints would be difficult.

Next, as in Patent Literature 2, when curing of the thermosetting resin and melting of the solder are conducted without any load applied from the electronic component toward the circuit member, extra effort is required to pre-coat the electrode on the circuit member with the solder in advance, and furthermore, the lower end portions of the solder bumps need to be reliably wedged into the pre-coat solder. When such wedging cannot be secured, the thermosetting resin becomes interposed between the electrodes and poor bonding occurs therebetween. Particularly, when inorganic particles such as those of silica are dispersed as fillers in the thermosetting resin, the occurrence rate of poor bonding becomes higher.

Solution to Problem

In view of the above, an object of the present invention is to shorten the takt time for mounting, while also ensuring reliability of the solder joints.

That is, one aspect of the present invention relates to an electronic component mounting method comprising the steps of:

(i) placing an electronic component having a primary surface on which a first electrode is formed, on a circuit member having a primary surface on which a second electrode corresponding to the first electrode is formed, with solder and a bonding material including a thermosetting resin interposed between the first and second electrodes;

(ii) subjecting the thermosetting resin to a first heating at a temperature lower than the melting point of the solder and thus causing the resin to cure, while pressing the electronic component against the circuit member; and then releasing pressure applied for the pressing; and (iii) subjecting the solder interposed between the first and second electrodes to a second heating with the pressure released, and thus melting the solder to electrically connect the first and second electrodes.

Another aspect of the present invention relates to an electronic component mounting line for mounting an electronic component having a primary surface on which a first electrode is formed, on a circuit member having a primary surface on which a second electrode corresponding to the first electrode is formed, the mounting line comprising:

a circuit member conveyor for conveying the circuit member;

a feeding machine for feeding the circuit member onto the circuit member conveyor;

an electronic component placement machine arranged downstream of the feeding machine, for placing the electronic component on the circuit member, such that solder and a bonding material including a thermosetting resin are interposed between the first and second electrodes;

a first heating machine arranged downstream of the electronic component placement machine, provided with a bonding tool configured to abut onto a surface on the opposite side of the primary surface of the electronic component and used for subjecting the thermosetting resin to a first heating at a temperature lower than the melting point of the solder via the electronic component and thus causing the thermosetting resin to cure, while pressing the electronic component against the circuit member, and a second heating machine arranged downstream of the first heating machine, for melting the solder interposed between the first and second electrodes, with pressure applied for the pressing released.

Advantageous Effect of Invention

According to the present invention, in mounting the electronic component on the circuit member by forming the solder joint and the resin-reinforced portion with use of the solder and the thermosetting resin, the takt time for the mounting can be shortened; and also, the solder joint can be formed to have high reliability at low cost.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
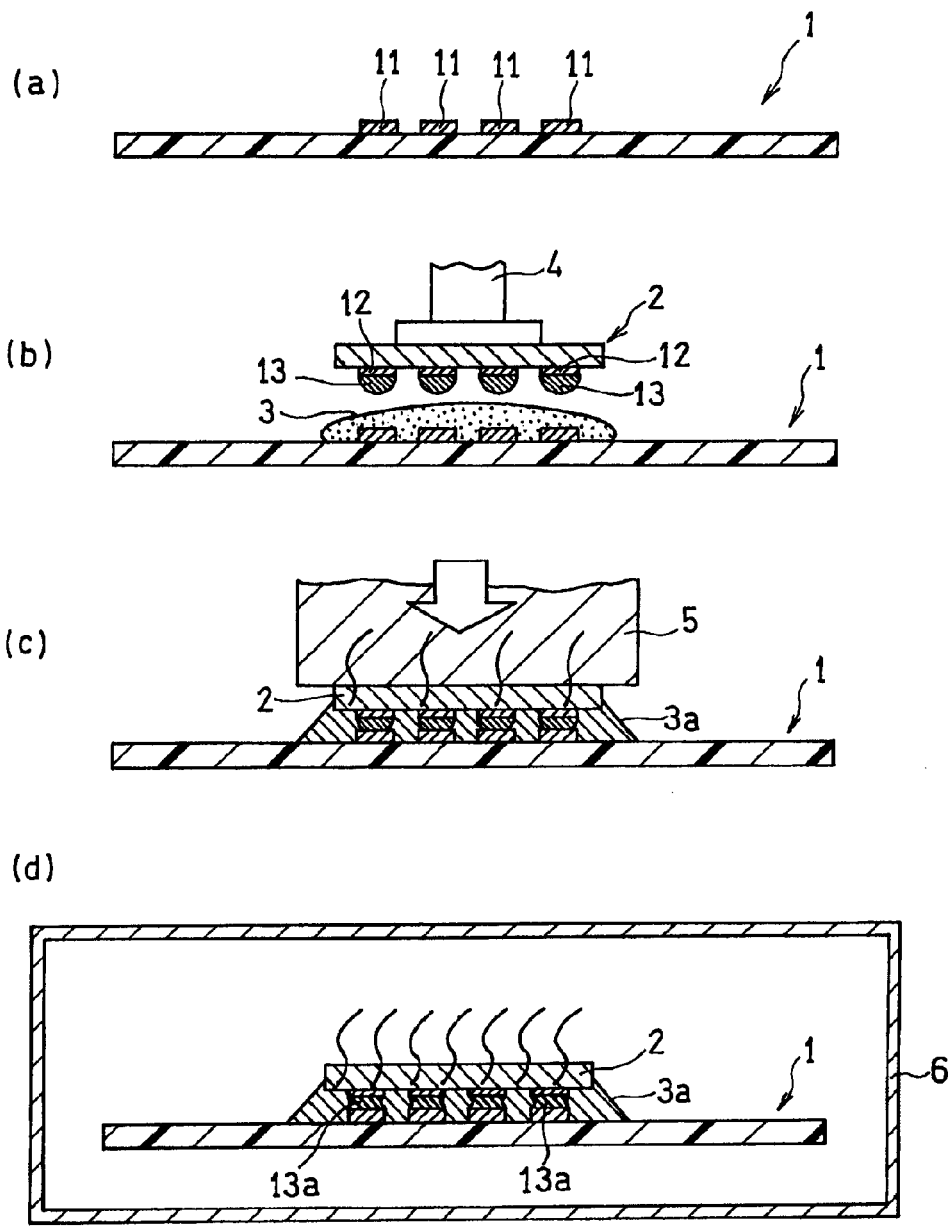
FIGS. 1(a) to 1(d) are illustrations depicting the flow of processes in an electronic component mounting method according to one embodiment of the present invention.

The present invention relates to a method of mounting an electronic component having a primary surface on which a first electrode is formed, on a circuit member having a primary surface on which a second electrode corresponding to the first electrode is formed. This mounting is typically conducted as a process in which both of the electronic component and the circuit member are heated at once, with solder and a bonding material including a thermosetting resin interposed between the first and second electrodes. As a result of this mounting, the electronic component is bonded to the circuit substrate via a solder joint. The thermosetting resin becomes a cured substance and serves as a resin-reinforced portion for protecting the solder joint.

The kind of the electronic component for mounting is not particularly limited, and may be, for example, a bear chip or a packaged component provided with an interposer. The present invention is particularly suited for use in surface mounting such as flip-chip mounting. The electronic component may be a BGA-type (Ball Grid Array-type) provided with solder bumps on its primary surface having the first electrode or an electronic component not provided with solder.

The circuit member is not particularly limited, and examples include: a circuit substrate (e.g., paper phenolic substrate, glass-reinforced epoxy substrate, flexible substrate made of resin, ceramic substrate) having lands on its primary surface; and an electronic component which serves as a base in a chip-on-chip (COC) structure. The second electrode on the circuit member may be an electrode that is pre-coated with solder in advance.

The electronic component mounting method of the present invention has a step of placing the electronic component on the circuit member, with a solder and a bonding material including a thermosetting resin interposed between the first electrode on the component and the second electrode on the circuit member. For example, the circuit member is placed on a mounting stage such that the second electrode faces vertically upward; and then the bonding material including the thermosetting resin is applied to the upper surface of the circuit member so as to cover the second electrode.

When at least one of the first electrode and the second electrode is provided with solder, it suffices if only a thermosetting resin is supplied to the upper surface of the circuit member. In contrast, when neither the first electrode nor the second electrode is provided with solder, a granulated substance of solder (solder particles) may be dispersed in a bonding material including the thermosetting resin and the resultant may be supplied between the electronic component and the circuit member. Note that the solder and the thermosetting resin need not necessarily be supplied to the circuit member, and may be supplied to the electronic component so as to cover the first electrode. For example, a bonding material including a thermosetting resin may be applied to the primary surface of the electronic component in advance, so as to cover at least a part of the solder bumps on a BGA-type electronic component. In that case, the solder and the bonding material can be supplied between the first and second electrodes by merely placing the electronic component on the circuit member such that the first and second electrodes face each other, and therefore, the production process can be simplified.

Subsequently, while the electronic component is pressed against the circuit member, the thermosetting resin is subjected to a first heating at a temperature lower than the melting point of the solder, and cures as a result; and thereafter, pressure applied for the pressing is released. At that time, if the electronic component is pressed against the circuit member while heating is conducted at a temperature equal to or higher than the melting point of the solder, control of the pressure would be very difficult. If the pressure becomes excessive, the molten solder may protrude from between the electronic component and the circuit member, or spread outward therefrom. On the other hand, when a curing reaction in the thermosetting resin is made to progress at a temperature lower than the melting point of the solder, control of the pressure is relatively easy. This is because the solder serves as a spacer between the primary surface of the electronic component and the primary surface of the circuit member, and counteracts the pressure. To prevent melting of the solder while causing sufficient curing of the thermosetting resin, the difference between the melting point of the solder and the temperature at which the curing reaction progresses in the thermosetting resin is preferably 10° C. or higher. Moreover, in view of forming a solder joint at a lowerer temperature, the temperature difference is preferably 100° C. or lower.

The temperature for the first heating varies depending on the melting point of the solder and the kind of the electronic component used, and is, for example, preferably 130° C. to 200° C. If the temperature is too low, it would take a relatively longtime for the curing reaction to progress in the thermosetting resin. If the temperature is too high, it would be difficult to prevent melting of the solder.

The pressure for pressing the electronic component against the circuit member is not particularly limited, and may be set arbitrarily in view of factors such as deformation in the circuit member and height of the solder bumps. For example, a load may be applied to the extent that the solder interposed between the first and second electrodes excludes the interposition of the thermosetting resin and at least has point contact, preferably face contact, with the first and second electrodes. However, when the bonding material includes powder of an inorganic material as a filler, since contact between the solder and the electrodes tend to be interrupted by the filler, application of sufficient load is preferable.

In the pressing, at least a part of the solder interposed between the first and second electrodes is preferably made to deform. Due to making the solder deform, it is possible to more reliably form a highly-reliable solder joint. Presumably, such deformation of the solder causes stress to be stored therein, and thus causes the solder to actively wet the electrodes when it melts.

Subsequently, under a condition where the pressure for the pressing is released, the solder interposed between the first and second electrodes is subjected to a second heating and melted; and the molten solder is brought into contact with the first and second electrodes. This process is conducted under a condition where the electronic component does not receive any pressure from the outside. Therefore, the solder interposed between the electronic component and the circuit member may be heated, together with the component and the member, in a typical reflow furnace or oven. Therefore, the mounting system configuration is simplified, making it possible to conduct electronic component mounting at low cost.

In the step of placing the electronic component on the circuit member, with the solder and the bonding material including the thermosetting resin interposed between the first electrode on the component and the second electrode on the member, a plurality of the electronic components may be placed on at least one of the circuit members. In that case, the thermosetting resin can be heated at a temperature lower than the melting point of the solder, while the plurality of the electronic components is pressed at once against the at least one circuit member. As long as the temperature is lower than the melting point of the solder, the electronic components can be pressed against the circuit member with relatively high pressure; and therefore, variation in the applied load among the electronic components can be reduced. Therefore, even if the plurality of the electronic components is pressed at once, it is possible for the first electrodes on all of the components and the corresponding second electrodes to produce point or face contact with the solder.

On the other hand, in melting the solder interposed between the first electrodes on the plurality of the electronic components and the second electrodes on the at least one circuit member, the pressure applied to all of the electronic components for the pressing may be released. Then, all of the electronic components, together with the circuit member, may be subjected to the second heating in the reflow furnace or oven. According to this mounting method, it is not necessary to place the electronic components one by one on the circuit member or to repeat the first and second heatings. Therefore, it is possible to conduct mounting with efficiency and to thus reduce costs for electronic component mounting.

The thermosetting resin used in the bonding material is not particularly limited, and examples include epoxy resin, phenol resin, melamine resin, urethane resin, acryl resin, and bismaleimide resin. The thermosetting resin may include, for example, a curing agent, a curing accelerator, and a reactive diluent. For example, for a curing agent for epoxy resin, acid anhydride, aliphatic or aromatic amine, imidazole, or a derivative thereof is preferably used. For a curing accelerator, dicyandiamide can be given as one example. The bonding material may further include, for example, carbon black and powder of an inorganic material (ceramic particles such as those of silica).

The bonding material may include substances such as flux and an activator. This enables wettability of the molten solder on the electrodes to be more readily secured. For the activator, for example, at least one selected from the group consisting of organic acid, amines, and halides thereof can be used. For the halogen included in the halides, bromine and chlorine can be given as examples.

Solder particles may be dispersed in the bonding material. The content of the solder particles is not particularly limited, and may be, for example, 20 to 60 mass % relative to the total of the solder particles and the thermosetting resin. The bonding material in which the solder particles are dispersed is convenient when neither the electrodes on the electronic components nor the electrodes on the circuit member are provided with solder bumps or pre-coat solder.

The kind of the solder used is not particularly limited, and can be, for example, Sn-based solder or gold solder. Examples of Sn-based solder include Sn—Ag alloy, Sn—Bi alloy, Sn—Ag—Cu alloy, Sn—Bi—Ag alloy, Sn—Cu alloy, Sn—Sb alloy, Sn—Ag—Cu—Bi alloy, Sn—Ag—Bi—In alloy, Sn—Ag—Cu—Sb alloy, Sn—Zn alloy, and Sn—Zn—Bi alloy.

In the following, electronic component mounting methods according to embodiments of the present invention will be described with reference to drawings.

Embodiment 1

Step (i)

Here, a description will be given of flip-chip mounting in which: a bear chip with first electrodes 12 each provided with a solder bump 13 is used for an electronic component 2 having a primary surface on which a first electrode is formed; and a circuit substrate 1 having lands 11 is used for a circuit member having a primary surface on which a second electrode is formed.

First, as illustrated in FIG. 1 (a), the circuit substrate 1 is arranged on a predetermined stage such that the lands 11 formed on its primary surface face vertically upward.

Then, as illustrated in FIG. 1(b), a bonding material 3 including a thermosetting resin is applied so as to cover the lands 11 on the circuit substrate 1. The form of the bonding material is not particularly limited, and may be a paste or a solid such as a film. The bonding material in paste form can be applied so as to cover the lands 11, by using a dispenser of a commercially-available bonding material application machine. The bonding material in solid form such as a film can be arranged on the circuit substrate 1 so as to cover the lands 11, by using a commercially-available component placement machine.

Thereafter, the electronic component 2 with the solder bumps 13 is placed on the primary surface of the circuit substrate 1. In placing the electronic component 2, first, respective positions of the electronic component 2 and the circuit substrate 1 are adjusted so that the solder bumps 13 would each land on the corresponding land 11 via the bonding material 3. The electronic component 2 may be placed on the circuit substrate 1 by using, for example, a commercially-available electronic component placement machine provided with a suction nozzle 4.

Step (ii)

Then, as illustrated in FIG. 1(c), while the electronic component 2 is pressed against the circuit substrate 1 and load is applied from the component toward the substrate, the bonding material 3 is subjected to a first heating via the electronic component 2. The pressing and the first heating are conducted by using a bonding tool 5 having an abutting surface for abutting onto a back surface (surface on opposite side of primary surface) of the electronic component 2 and also having a heating function for heating the abutting surface. The abutting surface of the bonding tool 5 is flat so that pressure can be uniformly applied to the electronic component 2, and preferably has an area larger than that of the back surface of the electronic component 2. Due to the electronic component 2 being pressed with application of sufficient load, the solder bumps 13 are slightly crushed between the lands 11 on the circuit substrate 1 and the electronic component 2, and deforms. At that time, face contact is produced between each of the solder bumps 13 and the electrodes. Meanwhile, a curing reaction progresses in the thermosetting resin included in the bonding material.

The temperature of the abutting surface of the bonding tool 5 during pressing of the electronic component 2 is adjusted to a temperature lower than the melting point of the solder bumps 13 and appropriate for curing the thermosetting resin, by a temperature adjusting function incorporated in the tool together with the heating function. At a point in time when curing of the thermosetting resin has progressed sufficiently and the cured substance has formed a resin-reinforced portion, the pressing of the electronic component 2 by the bonding tool 5 is released. The resin-reinforced portion 3a is filled in the gaps around the solder bumps 13 and has a function to protect solder joints formed in a later process.

Thereafter, the bonding tool 5, with the temperature of its abutting surface maintained at a temperature lower than the melting point of the solder bumps 13 and appropriate for curing the thermosetting resin, can move to a position above another electronic component 2 that is to be pressed next and repeat the pressing on that electronic component 2. Therefore, the temperature of the bonding tool 5 does not have to be changed, and even when two or more electronic components 2 are mounted in succession, the takt time can be shortened considerably.

It is possible to melt the solder bumps 13 by the bonding tool 5 subsequent to formation of the resin-reinforced portion 3a. However, to melt the solder bumps 13 in such manner, the temperature of the abutting surface of the bonding tool 5 needs to be raised once to a temperature at which the solder bumps 13 would melt. Moreover, when two or more electronic components 2 are mounted in succession, the temperature of the abutting surface of the bonding tool 5 needs to be lowered to below the melting point of the solder bumps 13. Therefore, it takes time to adjust the temperature of the abutting surface of the bonding tool 5, and is difficult to shorten the takt time for mounting.

Step (iii)

Then, under a condition where pressure for pressing the electronic component 2 is released, the solder bumps 13 interposed between the lands 11 and the electronic component 2 are subjected to a second heating and melted. As a result, the molten solder spreads out on the lands 11 and the first electrodes 12 on the electronic component 2. Thereafter, when the temperature of the solder lowers, the solder solidifies and forms solder joints 13a. The manner of the second heating is not particularly limited, as long as the load from the electronic component 2 toward the circuit substrate 1 is not applied. For example, as illustrated in FIG. 1(d), the circuit substrate 1 on which the electronic component 2 is placed may be put into an oven 6 and heated at a temperature equal to or higher than the melting point of the solder bumps 13.

Embodiment 2

In the following, a description will be given of the case where a plurality of the electronic components 2 is placed at once on one of the circuit substrates 1. Note that the number of the circuit substrates 1 is not limited to one. For example, the case of ten electronic components 2 mounted on two circuit substrates 1, i.e., five components per substrate, (that is, the case of two or more electronic components divided and mounted on at least two circuit substrates) is also to be included in the present embodiment.

Step (i)

Figure 2:
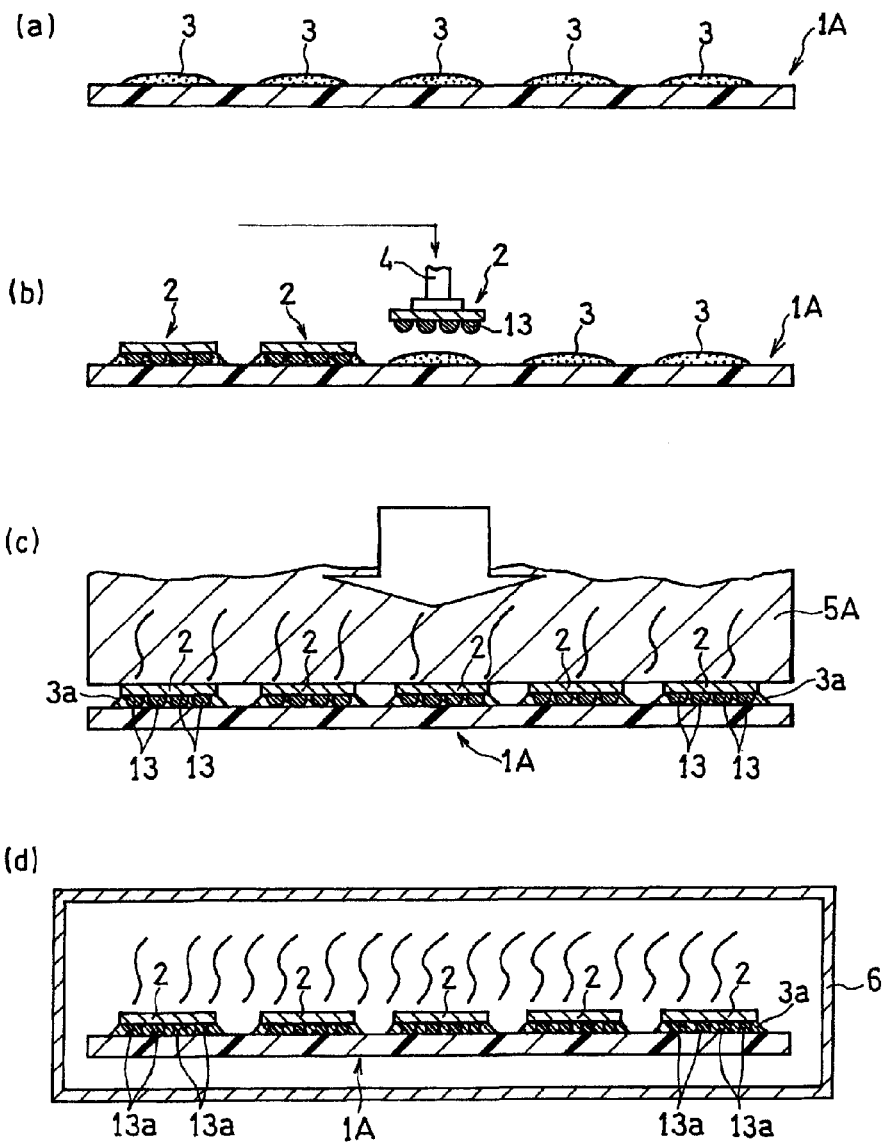
FIGS. 2(a) to 2(d) are illustrations depicting the flow of processes in an electronic component mounting method according to another embodiment of the present invention.

First, as illustrated in FIG. 2(a), the circuit substrate 1A having placement positions for the electronic components 2 is arranged on a predetermined stage, such that the lands (not illustrated) formed on the primary surface of the substrate face vertically upward. Then, a bonding material 3 including a thermosetting resin is applied to the placement positions for the electronic components, so as to cover the lands on the circuit substrate 1A. The form of the bonding material 3 and the manner of its application to the circuit substrate 1A are not particularly limited, and are similar to those in Embodiment 1. Thereafter, the electronic components 2 each having the solder bumps 13 are sequentially placed on the primary surface of the circuit substrate 1A. Although FIG. 2 illustrates the case where the electronic components 2 are placed one by one on the corresponding placement positions on the circuit substrate 1A, depending on the specifications of the electronic component placement machine used, it is also possible to place all of the electronic components 2 at once on the corresponding placement positions.

Step (ii)

Then, as illustrated in FIG. 2(c), while the electronic components 2 are pressed at once against the circuit substrate 1A and load is applied from the components toward the substrate, the bonding material 3 is subjected to the first heating via the electronic components 2. The pressing and the first heating can be conducted by using the bonding tool 5A having an abutting surface large enough to abut onto all of the back surfaces of the electronic components 2 and also having a heating function for heating the abutting surface. Due to the pressing of the electronic components 2 and the first heating conducted at once as above, the takt time for mounting can be made shorter than that in the case of Embodiment 1.

Here also, the abutting surface of the bonding tool 5A is flat so that pressure can be uniformly applied to all of the electronic components 2, and preferably has an area larger than that of the region on which all of the electronic components 2 are placed. Moreover, the pressure applied for the pressing is preferably of a magnitude to the extent of slightly crushing and deforming the solder bumps 13. The temperature of the abutting surface of the bonding tool 5A during pressing of the electronic components 2 is adjusted to a temperature lower than the melting point of the solder bumps 13 and appropriate for curing the thermosetting resin. Thereafter, at a point in time when curing of the thermosetting resin between all of the electronic components 2 and the circuit substrate 1A has progressed sufficiently and the resin-reinforced portions 3a have been formed, both of the pressing and the heating of the electronic components 2 by the bonding tool 5A may be released at once.

Since the first heating is conducted at a temperature lower than the melting point of the solder bumps 13, the solder bumps 13 serve as spacers between the electronic components 2 and the circuit substrate 1A. Therefore, it is possible to press the electronic components 2 with relatively high pressure. Thus, it is possible to prevent an inconvenient situation where, for apart of the electronic components, the solder bumps 13 do not achieve contact with the lands.

Step (iii)

Then, as illustrated in FIG. 2(d), under a condition where the pressure for pressing all of the electronic components 2 is released, the circuit substrate 1A to which the electronic components 2 have been bonded via the cured substance of the thermosetting resin (resin-reinforced portions 3a) is put into the oven 6 and subjected to the second heating. Thus, all of the solder bumps 13 on the electronic components 2 can be melted at once. Therefore, for the electronic components 2, all of the solder joints 13a can be formed at once.

In the following, a description will be given of a mounting line for conducting the electronic component mounting method of the present invention.

Figure 3:
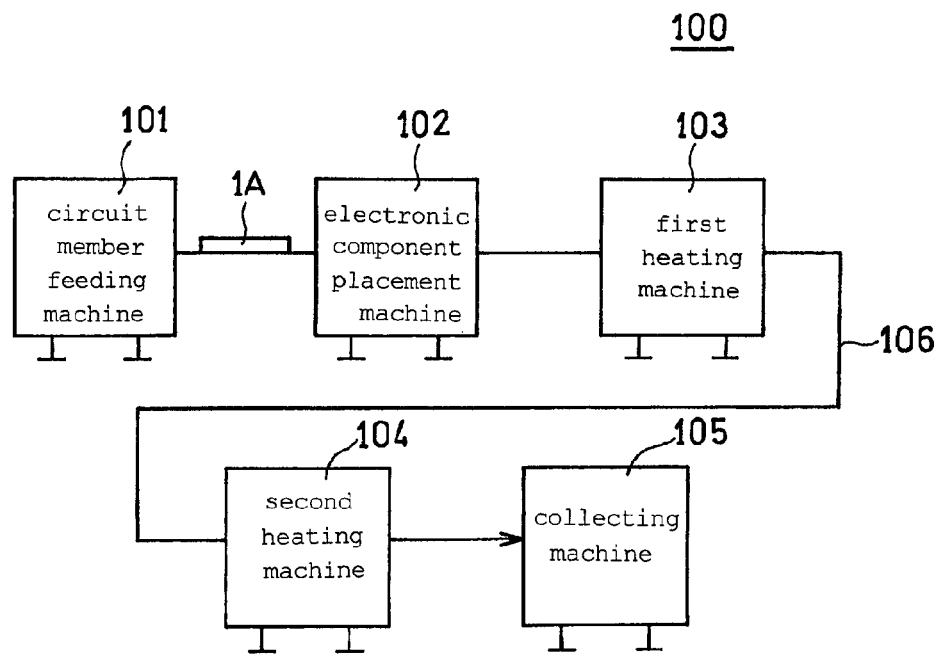
FIG. 3 is a schematic block diagram of an electronic component mounting line according to one embodiment of the present invention.

FIG. 3 is a block diagram of a simplified version of an electronic component mounting line (hereafter, also simply referred to as mounting line) for mounting a plurality of electronic components on a circuit substrate 1A, according to an embodiment of the present invention. A mounting line 100 includes: a feeding machine 101 for feeding the circuit substrate 1A; an electronic component placement machine 102; a first heating machine 103; a second heating machine 104; and a collecting machine 105 for collecting the circuit substrate 1A that has completed the mounting process. Furthermore, the mounting line 100 includes a conveyor 106 for conveying the circuit substrate 1A from the feeding machine 101 to the electronic component placement machine 102, the first heating machine 103, and the second heating machine 104, in this order, and ultimately to the collecting machine 105. Attached to the conveyor 106 is a stage for holding the circuit substrate 1A. The conveyor 106 conveys the circuit substrate 1A, by moving the stage holding the substrate from upstream to downstream of the mounting line.

In the following, a description will be given of the case where a plurality of the electronic components 2 of a BGA type illustrated in FIG. 1 or FIG. 2 is mounted on the circuit substrate 1A illustrated in FIG. 2.

The electronic component placement machine 102 is a complex machine having a function of applying the bonding material 3 including the thermosetting resin to the circuit substrate 1A fed from the feeding machine 101, and then placing the electronic components 2 on the circuit substrate 1A. That is, the electronic component placement machine 102 has, on the upstream side therein, an application unit for applying the bonding material 3 to the circuit substrate 1A; and on the downstream side therein, a placement unit for placing the electronic components 2 on the circuit substrate 1A. Thus, inside the same machine, the electronic components 2 can be mounted on the circuit substrate 1A immediately after the bonding material 3 is fed to the circuit substrate 1A. Thus, the takt time for mounting can be made shorter.

When the electronic components 2 are provided with a thermosetting resin in advance on their respective primary surfaces having the first electrodes, or, when the circuit substrate 1A is provided with a thermosetting resin in advance on its primary surface having the second electrodes, the application unit for applying the bonding material 3 is not necessary. Moreover, instead of using the complex machine, an application machine for applying the bonding material 3 may be separately arranged upstream of the electronic component placement machine 102.

On the upstream side in the electronic component placement machine 102, first, the application unit provided with an application head (dispenser) applies the bonding material 3 including the thermosetting resin to the circuit substrate 1A. The application head is capable of moving to an arbitrary position due to a three-axis movement mechanism, and the motion of this three-axis movement mechanism is controlled by a predetermined control device. Here, the motion of the application head is controlled, such that the lands 11 on the primary surface of the circuit substrate 1A would be covered with the bonding material 3 fed from the application head. The timing at which the bonding material 3 is dispensed from the application head and the amount of the bonding material 3 applied are controlled by the control device. Usually, the bonding material 3 is applied to the circuit substrate 1A, at each of the placement positions for the electronic components 2.

Subsequently, on the downstream side in the electronic component placement machine 102, the placement unit places each of the electronic components 2 on the circuit substrate 1A. The placement unit is provided with, for example: a feeding stage for feeding a tray on which the electronic components 2 are arranged in a matrix; a mounting head; a three-axis movement mechanism for moving the mounting head; and a control device for controlling the motion of the three-axis movement mechanism. The mounting head is provided with a suction nozzle 4, and picks up the electronic component 2 by suction and releases the electronic component 2 at an arbitrary position by suction release. Here, the electronic component 2, with its solder bumps 13 facing vertically downward, is picked up from the tray by the suction nozzle 4 and moved to a position above the electronic component placement position on the circuit substrate 1A. Then, after the electronic component 2 lands on the corresponding placement position on the circuit substrate 1A by an up-and-down movement of the mounting head due to the three-axis movement mechanism, suction by the suction nozzle is released. Operations similar to the above are conducted several times, thereby to enable placement of each of the electronic components 2 on the corresponding electronic component placement position on the circuit substrate 1A.

Then, the circuit substrate 1A, on which the electronic components 2 are placed, is conveyed to the first heating machine 103 and positioned there. The first heating machine 103 is provided with the bonding tool 5A having an abutting surface capable of abutting onto a plurality of the electronic components 2 at once; and also, of pressing the plurality of the electronic components 2 at once against the circuit substrate 1A with pressure applied from above. The bonding tool 5A has, for example: a function of applying pressure from above downward with use of an actuator for pressure application (e.g., oil hydraulic cylinders, air cylinders); and a heating function of heating the abutting surface which abuts onto the electronic components 2.

In the first heating machine 103, first, the abutting surface of the bonding tool 5A is brought into contact with the back surfaces of the electronic components 2 on the positioned circuit substrate 1A, at once; and the electronic components 2 are pressed at once against the circuit substrate 1A, with use of the actuator for pressure application. During the pressing, the temperature of the abutting surface of the bonding tool 5A is controlled so that a curing reaction in the thermosetting resin would progress and the solder would not melt. The curing reaction in the thermosetting resin may also be accelerated by inclusion of a heating means in the stage on which the circuit substrate 1A is placed. Thereafter, at a point in time when the curing reaction in the thermosetting resin has sufficiently progressed, the pressing by the bonding tool 5A is released.

Then, the circuit substrate 1A is conveyed to the second heating machine 104. The second heating machine 104 is not particularly limited, and may be, for example, a reflow furnace having a tunnel-like heating space. The circuit substrate 1A, while being conveyed by the conveyor 106 inside the tunnel-like furnace, is subjected to the second heating at a temperature equal to or higher than the melting point of the solder bumps 13. During this second heating, external force as used in pressing the electronic components 2 against the circuit substrate 1A is not necessary. The circuit substrate 1A that has passed through the reflow furnace may be left to cool, or may be cooled with use of a blower such as a fan. Thus, all of the solder bumps 13 on the electronic components 2 are bonded at once to the corresponding lands 11 on the circuit substrate 1A.

Thereafter, the circuit substrate 1A (mounting structure), on which the electronic components 2 have been mounted, is collected by the collecting machine 105. The collecting machine 105 is provided with, for example, an unloader for storing the circuit substrate 1A on which the electronic components 2 are mounted in a rack or the like.

In the following, a description will be given of the structure of the solder joint.

Figure 4:
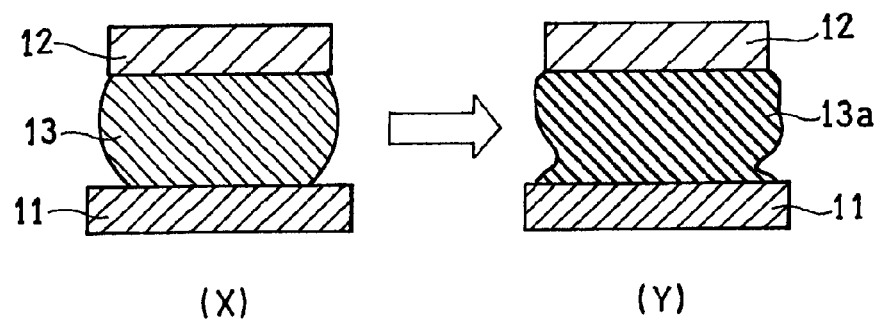
FIGS. 4(X) and 4(Y) are schematic vertical-sectional views of a solder bump and electrodes before a second heating, and of a solder joint after the second heating.

FIG. 4(X) schematically illustrates the state of the solder bump 13 before being subjected to the second heating at a temperature equal to or higher than the melting point of the solder. This solder bump 13 is slightly crushed between the first electrode 12 on the electronic component and the second electrode 11 on the circuit member. This is because, in the first heating for curing the thermosetting resin, the electronic component is pressed against the circuit member. On the other hand, the crushed solder bump 13 is surrounded by the cured substance of the thermosetting resin (not illustrated). Therefore, it is presumed that the pressure in the vertical direction applied to the solder bump 13 is not released, causing this pressure to remain as stress inside the solder bump 13.

FIG. 4(Y) schematically illustrates the state of the solder joint 13a after the second heating is conducted at a temperature equal to or higher than the melting point of the solder. It is presumed that, when the solder melts due to the second heating, the stress trapped inside the solder bump 13 is released and thus causes the molten solder to spread out and wet the first electrode 12 and the second electrode 11 with great momentum. At that time, although the resin-reinforced portion 3a, i.e., the cured substance of the thermosetting resin, is present around the solder bump, this cured substance of the thermosetting resin is presumed to be relatively soft as a result of the second heating. Therefore, despite the solder bump being surrounded by the resin-reinforced portion 3a, wetting of the first and second electrodes by the molten solder progresses even without the pressing of the electronic component against the circuit member; and some portions of the solder joint 13a consequently has a fillet-like shape as illustrated in the drawing. Due to the above, the solder joint 13a formed is presumed to be highly reliable.

Figure 5:
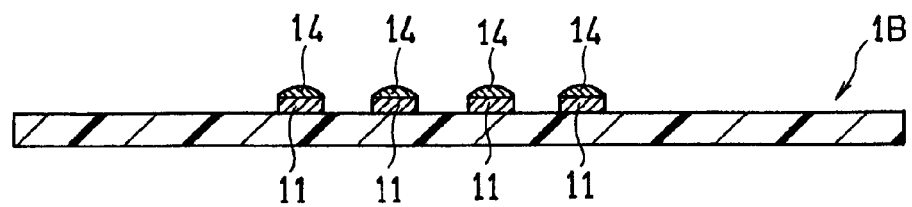
FIG. 5 is an illustration of an example of a circuit substrate having lands pre-coated with solder.

In the above Embodiments, a description was given of the case where the electronic component(s) with the solder bump(s) are mounted on the circuit substrate. However, an electronic component with solder bumps is merely one example of an electronic component that can be mounted by the mounting method and the mounting line of the present invention. When an electronic component without solder bumps is used, it can be mounted in a similar manner by using for a circuit substrate, for example, the circuit substrate 1B provided with solder 14 with which the lands 11 are pre-coated, as illustrated in FIG. 5.

Figure 6:
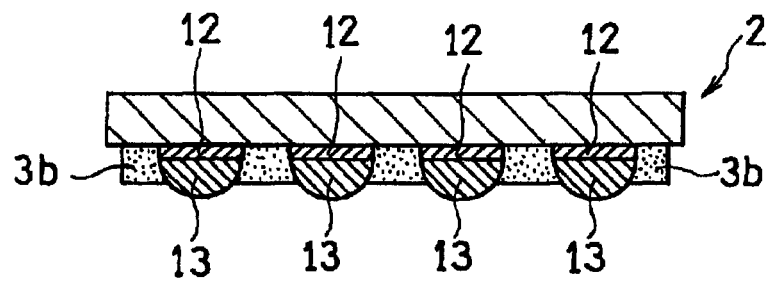
FIG. 6 is a vertical-sectional illustration of an example of an electronic component of which a primary surface having solder bumps is provided with a bonding material.

Moreover, in the above Embodiments, a description was given of the case where the bonding material including the thermosetting resin is applied so as to cover the lands on the circuit substrate. However, the bonding material may be provided to the electronic component in advance. For example, as illustrated in FIG. 6, the bonding material 3b as a solid including the thermosetting resin may be applied in advance to the electronic component 2, at its primary surface with the first electrode 12 thereon. Due to use of such electronic component 2 with the bonding material 3b adhered thereto, the process of applying the bonding material to the circuit substrate can be omitted, and therefore, the takt time can be made shorter. Moreover, by having the tip portion of the solder bump 13 protrude out of the bonding material 3b, contact between the solder bump 13 and the second electrode on the circuit substrate can be reliably secured, and therefore, the solder joint becomes more reliable.

Figure 7:
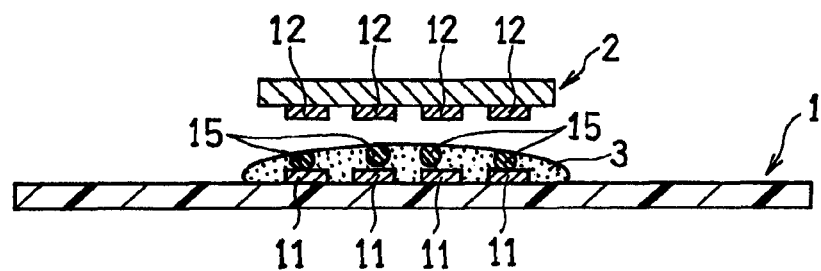
FIG. 7 is an illustration depicting a process of placing an electronic component on a circuit substrate, when the component is to be mounted thereon by using a bonding material in which solder particles are dispersed.

Furthermore, when neither the first electrode on the electronic component nor the second electrode on the circuit substrate is provided with solder in advance, mounting can be conducted in a similar manner by applying the bonding material 3 with solder particles 15 dispersed therein to the circuit substrate 1, as illustrated in FIG. 7. In that case, the bonding material acts as an anisotropic conductive adhesive.

In the following, the electronic component mounting method of the present invention will be specifically described byway of Examples. However, the following Examples do not limit the present invention.

Example 1

For a bonding material, a thermosetting resin composition including epoxy resin, a curing agent, carbon black, silica, and a coupling agent was used. Proportions of the above components were adjusted so that a curing reaction would progress at 150° C. in the resultant composition.

For a circuit member, a glass-reinforced epoxy substrate (FR4) was used.

For an electronic component, a BGA-type semiconductor chip (size: 7×7 mm, number of solder bumps: 700) was used.

For formation of the solder bumps, eutectic Sn—Ag solder (melting point: 221° C.) was used.

First, on the FR4 substrate, lands for 28 pieces of the electronic components were formed from copper foil, thereby to prepare a test substrate. On the test substrate, 1.5 mm$^3$ each of the bonding material was applied to the respective areas for placing the electronic components. Then, the electronic components were placed on the test substrate. At the time of this placement, precise position adjustment was conducted so that the solder bumps on the electronic components would face the corresponding lands.

(First Heating)

Subsequently, a bonding tool having a flat surface with an area as that of the FR4 substrate (72 cm$^2$) was prepared. Then, the flat surface of the bonding tool was made to abut onto back surfaces of all of the electronic components. Then, to the back surfaces of the electronic components, force (2.8 kN) was applied to the extent of slightly deforming the solder bumps, in a direction toward the test substrate. At that time, the temperature of the abutting surface of the bonding tool was made 150° C. by a built-in heater. As a result, the curing reaction in the bonding material was nearly completed after 300 seconds.

(Second Heating)

Subsequently, the pressing by the bonding tool was released; the test substrate with the electronic components placed thereon was put into an oven preheated to 260° C. and heated for 60 seconds; and then the resultant was cooled. Thus, solder joints were formed between the electronic components and the lands on the test substrate.

Thereafter, contact resistances of the solder joints on all of the electronic components were measured. As a result, all of the resistances were sufficiently small and electrical connections were in a favorable state. The total time required for the first and second heatings was 360 seconds.

Comparative Example 1

Operations similar to those in Example 1 were conducted, except for conducting the second heating subsequent to the first heating, without releasing the pressing by the bonding tool and with the applied force reduced to 0.56 kN and the temperature of the flat surface of the bonding tool raised to 260° C. Thereafter, contact resistances of the solder joints on all of the electronic components were measured. As a result, all of the resistances were sufficiently small and electrical connections were in a favorable state. Moreover, the net total time required for the first and second heatings was 360 seconds. However, 5 minutes were required to raise the temperature of the flat surface of the bonding tool to 260° C., and furthermore, 20 minutes were required for lowering the temperature thereof to the initial temperature. Moreover, in the second heating, precise control was required for the angle of the flat surface of the bonding tool and the magnitude of the load applied by the bonding tool, for pressure to be applied uniformly to all of the electronic components so that the molten solder would not protrude from between the electronic components and the test substrate.

Comparative Example 2

After the electronic components were placed on the test substrate, the resultant was put into an oven preheated to 150° C. and then subjected to the first heating without using the bonding tool, thereby to cause the curing reaction to progress in the thermosetting resin. Thereafter, the temperature of the oven was raised to 260° C. and the second heating was conducted. Thereafter, contact resistances of the solder joints on all of the electronic components were measured; and results showed a large variation among the resistances, making evident the low reliability of the solder joints.

As evidenced by the above results, at least the first heating needs to be conducted while the electronic components are pressed against the circuit member. Moreover, when the second heating is conducted, release of the pressing enables considerable shortening of the takt time for mounting.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The present invention is useful in the field of electronic component mounting in which electric components are mounted on a circuit member with use of thermosetting resin and solder. Moreover, the present invention enables shortening of the takt time for mounting, and also, formation of highly-reliable joints at low cost.

REFERENCE SIGNS LIST 1, 1A, 1B circuit substrate
2 electronic component
3 bonding material
3a resin-reinforced portion
4 suction nozzle
5, 5A bonding tool
6 oven
11 land (second electrode)
12 first electrode
13 solder bump 13a solder joint
14 pre-coat solder
15 solder particle
100 mounting line
101 feeding machine
102 electronic component placement machine
103 first heating machine
104 second heating machine
105 collecting machine

The invention claimed is:

1. An electronic component mounting method comprising the steps of:
   (i) placing a plurality of electronic component components, each having a primary surface on which at least one first electrode is formed, on a circuit member having a primary surface on which a plurality of second electrodes, each corresponding to the at least one first electrode, are formed, with solder and a bonding material including a thermosetting resin interposed between the at least one first electrode and a corresponding second electrode of the plurality of second electrodes;
   (ii) subjecting the thermosetting resin to a first heating using a first heating machine at a temperature lower than the melting point of the solder and thus causing the resin to cure, while pressing the plurality of electronic components at once against the circuit member; and then releasing pressure applied for the pressing; and
   (iii) subjecting the solder interposed between the at least one first electrode of each of the plurality of the electronic components and the corresponding second electrode on the circuit member to a second heating using a second heating machine while no mechanical pressure being applied to the plurality of electronic components in an entirety of the second heating until cooling, and thus melting the solder to electrically connect the at least one first electrode of each of the plurality of the electronic components and the plurality of second electrodes on the circuit member, respectively, while the at least one first electrode and the corresponding second electrode do not directly contact to each other.

2. The electronic component mounting method in accordance with claim 1, wherein, in the step (ii), at least a part of the solder interposed between the at least one first electrode and the corresponding second electrode is deformed due to the pressing.

3. The electronic component mounting method in accordance with claim 1, wherein the at least one first electrode has at least part of the solder as a bump.

4. The electronic component mounting method in accordance with claim 1, wherein the second electrodes are is pre-coated with at least a part of the solder.

5. The electronic component mounting method in accordance with claim 1, wherein at least a part of the solder is a granulated substance and dispersed in the bonding material.

6. The electronic component mounting method in accordance with claim 1, wherein the bonding material includes powder of an inorganic material as a filler.

* * * * *